United States Patent
Karlsson et al.

(10) Patent No.: US 6,215,677 B1
(45) Date of Patent: Apr. 10, 2001

(54) METHOD AND AN APPARATUS FOR CURRENT SENSING IN AN AC/DC CONVERTER

(75) Inventors: Mats Karlsson, Huddinge; Christer Thorén, Hägersten, both of (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/590,300

(22) Filed: Jun. 9, 2000

(30) Foreign Application Priority Data

Jun. 10, 1999 (SE) .................................................. 9902179

(51) Int. Cl.[7] ................................................. H02M 7/155
(52) U.S. Cl. ............................................................. 363/84
(58) Field of Search ................................. 3693/84, 125; 323/205, 207

(56) References Cited

U.S. PATENT DOCUMENTS

| | | | |
|---|---|---|---|
| 3,753,070 | * 8/1973 | Bunger et al. | 318/472 |
| 3,818,307 | * 6/1974 | Hamilton et al. | 363/25 |
| 4,206,490 | * 6/1980 | Parrier et al. | 361/42 |
| 5,191,518 | * 3/1993 | Recker et al. | 363/71 |
| 5,825,162 | * 10/1998 | Kida et al. | 323/210 |

* cited by examiner

*Primary Examiner*—Adolf Deneke Berhane
(74) *Attorney, Agent, or Firm*—Nixon & Vanderhye, P.C.

(57) ABSTRACT

In a multi-phase AC/DC converter provided with an artificial neutral point a voltage sensing circuit is provided. The voltage sensing circuit comprises three small windings connected to a first common point and to three impedances. In the circuit, the voltage between the first common point of the windings and a second common point of the impedances is measured. The voltage is indicative of the current flowing in the artificial neutral point. By using such a circuit the current sensing in the neutral point can be simplified and the multi-phase AC/DC converter made at a lower cost.

5 Claims, 3 Drawing Sheets

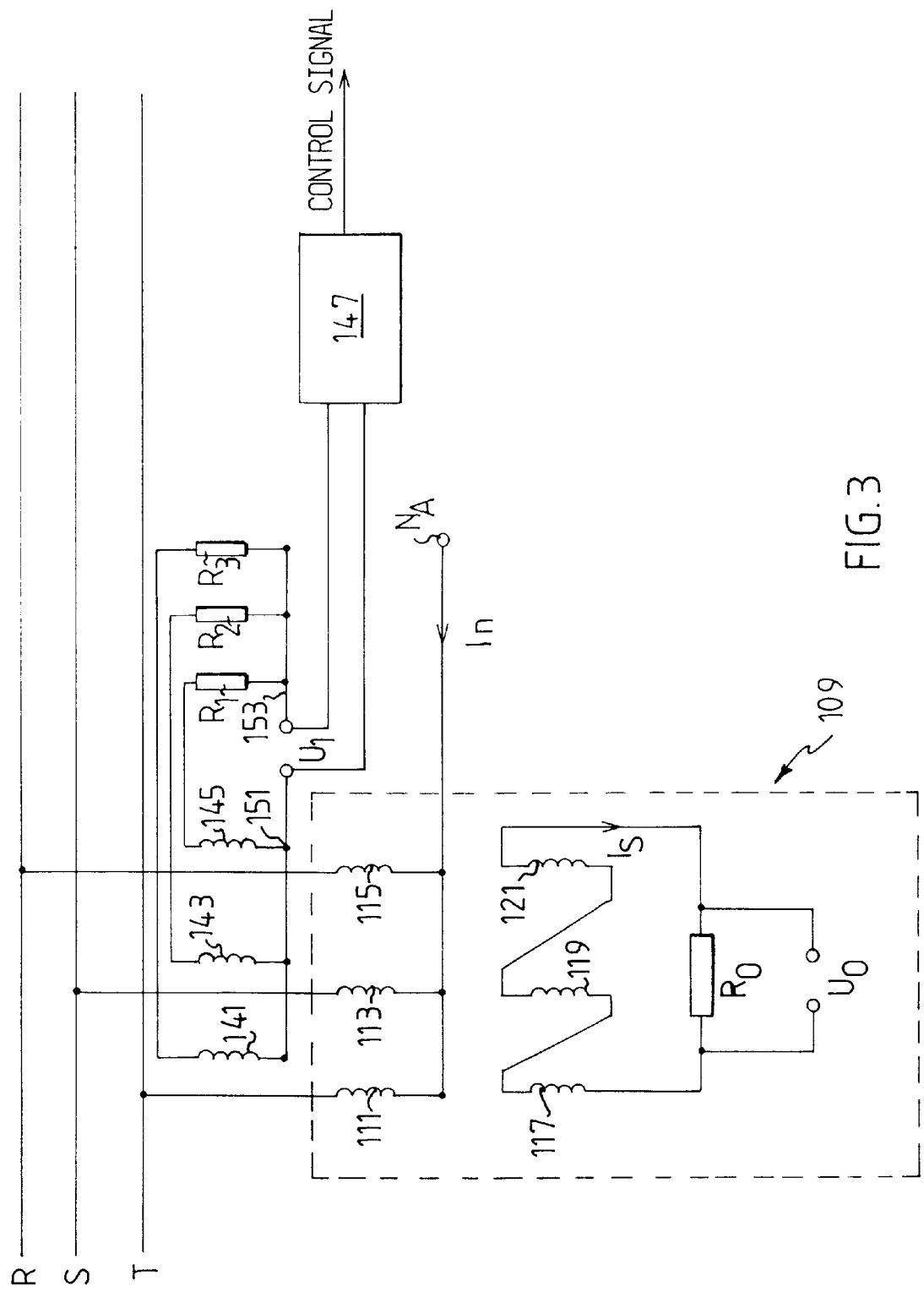

METHOD AND AN APPARATUS FOR CURRENT SENSING IN AN AC/DC CONVERTER

TECHNICAL FIELD

The present invention relates to current sensing in an AC/DC converter provided with an artificial neutral point.

BACKGROUND OF THE INVENTION AND PRIOR ART

In power supply systems there is often a need to convert a multi-phase voltage from the mains into a unidirectional current for supplying different kinds of electronic equipment, such as telecommunication equipment.

In such multi-phase AC/DC converters there is usually provided a number of single phase converters or single phase modules (SPM) in order to output a rectified current. However in such AC/DC converters it is sometimes not possible to access the neutral wire of the mains, which can be required for control purposes of the AC/DC converter. Thus, in order to make a multi-phase AC/DC converter operate safely, having control of the input voltage of each SPM and at the same time generate a correct output signal, the control mechanism of the AC/DC converter requires access to a neutral point. Thus, in order to make a multi-phase AC/DCconverter having SPM:s connected in a star connection operate safely, the common point of the SPM:s have to be connected to a stable neutral point.

In the case when there is no access to a neutral point from the neutral wire of the mains, an artificial neutral point (ANP) can be created by means of using three small transformers having their secondary sides connected in a delta configuration.

Such a circuit is described in the international patent application PCT/SE99/00744, which is incorporated herein by reference.

A problem when using the circuit as described in the international patent application PCT/SE99/00744 is that if there is an asymmetry in the supply voltage from the mains, i.e. that the sum of the phase voltages in the mains does not become zero, there will be a current in the circuit forming the artificial neutral point, which in turn will increase the power loss in the artificial neutral point of the converter. Such a power loss is of course a disadvantage. A current in the artificial neutral point may also origin from different input power to different SPM:s, the SPMs may have different efficiency or there may be an asymmetry in the supply voltage.

A circuit can be provided in order to minimize the power loss. Such a circuit is described in the international patent application PCT/SE99/00743, which also is incorporated herein by reference. Thus, in order to reduce the current in the artificial point circuit, a control circuit which measures the current in the delta configured loop of the artificial neutral point (ANP) is provided.

In FIG. 1 a diagram illustrating a 3-phase AC/DC converter as described in the international patent applications PCT/SE99/00743 and PCT/SE99/00744 is shown. Thus, the converter comprises a unit for deriving an artificial neutral point (ANP) 109 connected to the mains R,S,T, which supplies a signal indicative of asymmetries in the mains R,S,T to a control circuit 110. The control circuit controls the single phase converters or single phase modules (SPM) 103, 105 and 107 according to an algorithm designed to eliminate or minimize any current in the artificial neutral point.

However, in order to operate properly the control circuit 110 requires a signal indicative of the current on the secondary side of the ANP. A straight forward solution is to provide a current sensing unit directly in the neutral wire. Another possible solution is to detect the current in the loop on the secondary side in the ANP. Such solutions have however turned out to be costly and a simpler and cheaper method of providing a signal indicative of the current in the loop of the secondary side is therefore desired.

SUMMARY

It is an object of the present invention to provide a method and an apparatus by means of which a signal indicative of the artificial point current easily can be obtained.

This object is obtained by a voltage sensing circuit provided in connection with the artificial neutral point loop of the AC/DC converter. The voltage sensing circuit comprises a multitude , e.g. three, of small windings connected in a star configuration to a first common point and to three impedances.

In the circuit, the voltage between the first common point of the windings and a second common point of the impedances is measured. The voltage is indicative of the current flowing in the artificial neutral point using the resistance of the short-circuited secondary wire as a shunt.

By using such a circuit the current sensing in the neutral point can be simplified and the multi-phase AC/DC converter manufactured at a lower cost. Also the efficiency of the AC/DC converter will be improved.

BRIEF DESCRIPTION OF THE DRAWINGS

The present invention will now be described in more detail by way of non-limiting examples and with reference to the accompanying drawings, in which:

FIG. 3 is a circuit diagram of a 3-phase AC/DC converter. having a voltage sensing unit in connection to the artificial neutral circuitry.

DESCRIPTION OF PREFERRED EMBODIMENTS

Figure 2:
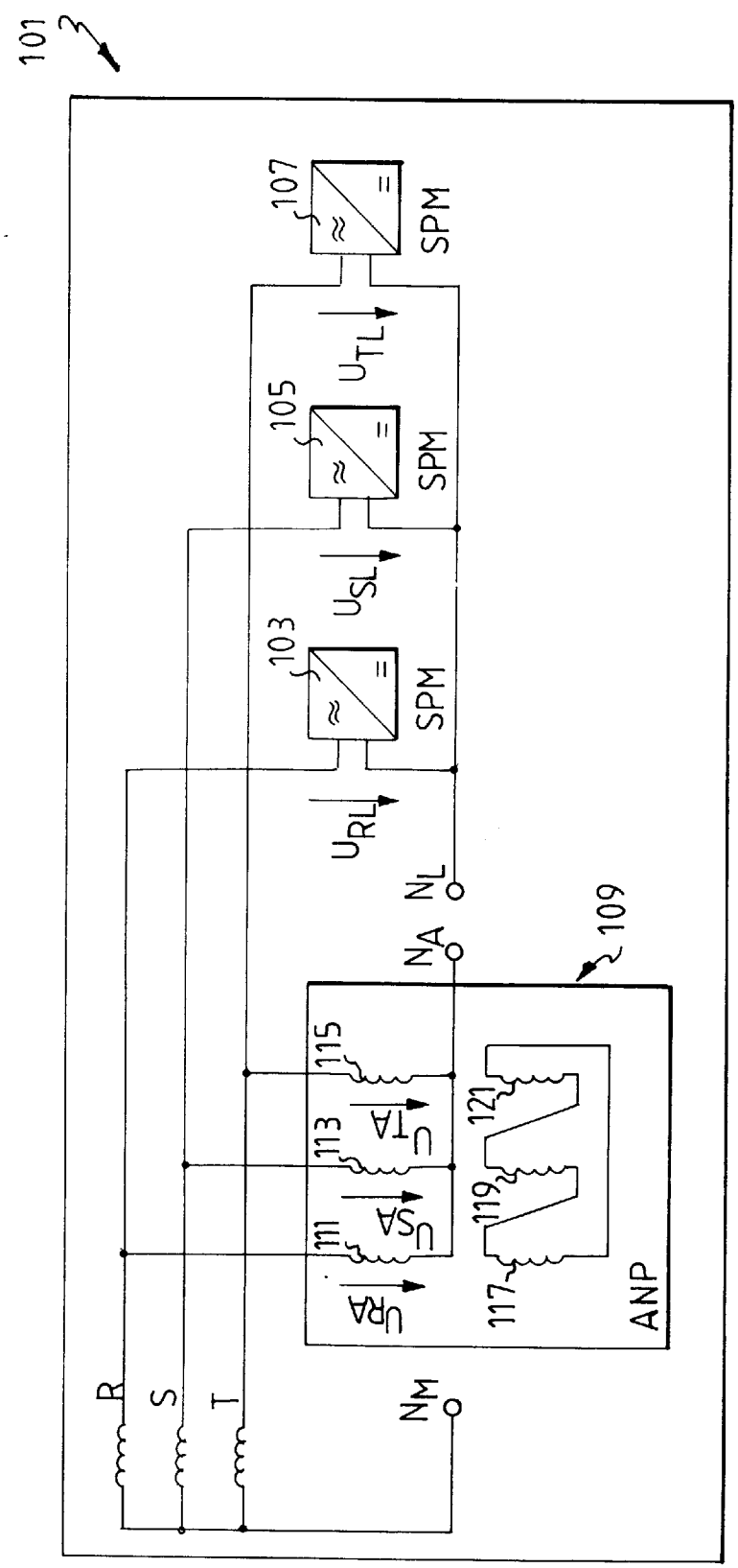
FIG. 2 is a circuit diagram of a 3-phase AC/DC converter.

In FIG. 2, a circuit diagram of a 3-phase AC/DC converter 101 as described in the international patent applications PCT/SE99/00743 and PCT/SE99/00744. Thus, the AC/DC converter 101 comprises three single phase AC/DC converters 103, 105 and 107. The three single phase AC/DC converters or single phase modules (SPM) 103, 105 and 107 are connected to the mains R, S and T, respectively.

Furthermore, the converter as shown in FIG. 2 comprises an artificial neutral point (ANP) 109. The ANP 109 comprises three primary windings 111, 113 and 115 and three secondary windings 117, 119 and 121. One terminal of each primary winding 111, 113 and 115 is connected to the mains R, S and T, respectively. The other ends of the windings 111, 113 and 115 are connected to a common point (Na) in a star connection.

The secondary windings 117, 119 and 121 are connected in series in a delta connection forming a closed loop, so that if the voltage supplied by the mains R,S,T is symmetric the currents resulting in the secondary windings will sum to zero. Hence, there will be no current in the closed loop on the secondary side in that case.

However, if there are any asymmetries in the voltage supplied from the mains R,S,T for some reason, a current will flow in the loop on the secondary side. Furthermore, the current will be relatively large, since there a very small impedance in the closed loop on the secondary side.

Figure 1:
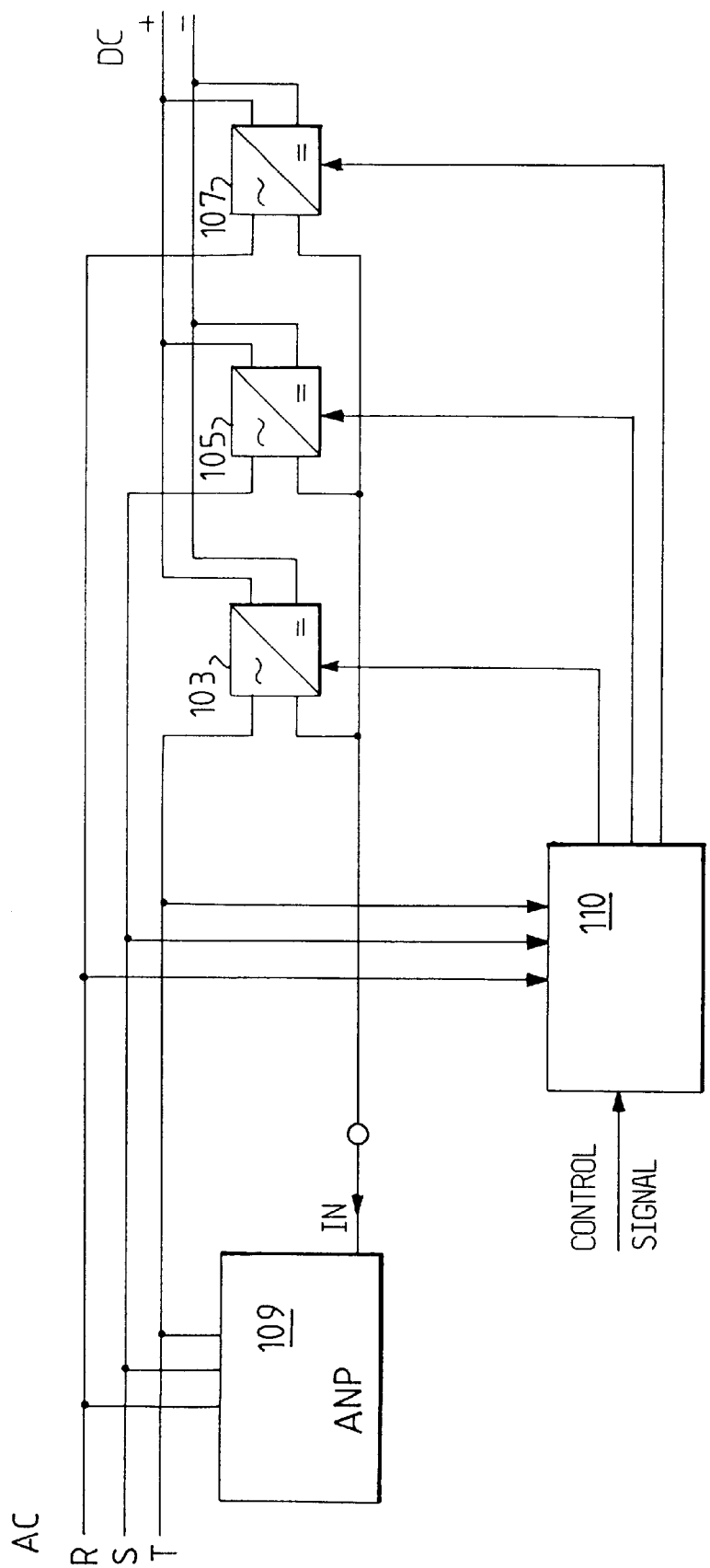
FIG. 1 is a diagram illustrating a 3-phase AC/DC converter.

As described in the international patent applications PCT/SE99/00743 and PCT/SE99/00744, a circuit can be provided in order to minimize the power loss of a AC/DC converter as shown in FIG. 1 and FIG. 2. Thus, in order to reduce the current in the artificial point circuit, a control circuit which measures the current in the delta configured loop of the artificial neutral point (ANP) is provided.

Thus, in order to operate properly the control circuit requires a signal indicative of the current on the secondary side of the ANP. A straight forward solution is to provide a current sensing unit directly in the secondary side loop of the ANP as described in the international patent applications PCT/SE99/00743 and PCT/SE99/00744. The solution as described therein is however costly.

In FIG. 3, a circuit diagram illustrating another possibility to obtain a signal indicative of the current in the secondary side loop of the ANP 109 is shown. Thus, three windings 141, 143 and 145 are arranged as secondary windings. The three windings 141, 143 and 145 are connected in a star configuration.

The common point 151 of the three windings 141, 143 and 145 is connected to a first terminal of a voltmeter or voltage sensing unit 147. The other ends of the windings 141, 143 and 145 are connected to three resistors R1, R2 and R3, respectively. The resistors R1, R2 and R3 have the same impedance and are connected to a common point 153.

The common point of the resistors R1, R2 and R3 is connected to the second terminal of the voltage sensing unit 147. Thus, the unit 147 measures the voltage U1 between the points 151 and 153 and is in turn connected to a control circuit, such as the control circuit 110, as shown in FIG. 1 for supplying a control signal to the control circuit.

Thus, with reference to FIG. 3 current (In) in the artificial neutral point NA, is equal to:

$$In = k_1 * Is \quad (1)$$

where Is is the current in the secondary loop of the ANP, i.e the current throw the resistor R0, which is the short circuit impedance of the secondary side loop, and where $k_1$ is a constant. This expression can be rewritten as:

$$In = k_1 * U0/R0 \quad (2)$$

where U0 is the voltage over the impedance R0.

However, due to the symmetry in the circuitry shown in FIG. 3, the voltage U0 will be proportional to the voltage U1. Also the impedance R0 is a constant. Thus, the expression (2) can be rewritten as:

$$In = k_2 * U1 \quad (3)$$

Hence, the voltage U1 will be proportional to the current in the artificial neutral point and can thus be used as control signal for controlling the SPMs of the 3-phase AC/DC converter.

In the connection as described with reference to FIG. 3, the three impedances R1, R2 and R3 forms an additional artificial neutral point, where the sum of the three phase voltages is zero at all times. This is due to that the artificial neutral point 153 formed by the three impedances R1, R2 and R3 has no load. The voltage in the point 151 will be proportional to the zero sequence voltage. The measured voltage drop between the point 151 and the artificial neutral point 153 will thus be proportional the zero sequence voltage, which in turn is proportional to the current in the artificial neutral point (Na). The output signal from the voltage sensing unit 147 can therefore be used as control signal.

By using the circuitry as described herein, the current sensing in the neutral point can be simplified and the multi-phase AC/DC converter manufactured at a lower cost. Also the efficiency of the AC/DC converter will be improved. The arrangement as described herein can also be used for other multi-phase electrical loads, such as lamps.

What is claimed is:

1. An apparatus for generating, in a multi-phase electrical load provided with a first artificial neutral point, a control signal indicative of the current in the neutral point, wherein the electrical load including a transformer comprising a multitude of primary windings connected to the respective individual input phases of the electrical load and to the first artificial neutral point, characterized by an arrangement forming a second artificial neutral point having no electrical load and a voltage sensing unit having one input terminal connected to the second artificial neutral point and another input terminal connected to a point having a voltage corresponding to the zero sequence voltage and where the voltage sensing unit output signal is provided as a control signal indicative of the neutral point current.

2. An apparatus according to claim 1, characterized in a that the arrangement forming the second artificial neutral point comprises a multitude of secondary windings one terminal of each being connected in a star configuration, the common point in the star configuration being connected to a first terminal of the voltage sensing unit, a multitude of impedances connected with one terminal to the second terminals of the secondary windings and the other terminals of the impedances being connected to a second terminal of the voltage sensing unit.

3. An apparatus according to claim 2, characterized in that the impedances are resistors.

4. An apparatus according to claim 1, characterized in that the electrical load is an AC/DC-converter.

5. A method of deriving, in a multi-phase electrical load having a first artificial neutral point, a control signal indicative of the current in the first artificial neutral point, characterized in that a voltage signal corresponding to the voltage difference between a second artificial neutral point having no electrical load and a point having a voltage corresponding to the zero sequence voltage is supplied as control signal indicative of the current in the first artificial neutral point.

* * * * *